(12) United States Patent
Liang

(10) Patent No.: US 9,190,805 B2
(45) Date of Patent: *Nov. 17, 2015

(54) DIRECT MODULATED LASER

(71) Applicant: HEWLETT-PACKARD DEVELOPMENT COMPANY, L.P., Houston, TX (US)

(72) Inventor: Di Liang, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/575,441

(22) Filed: Dec. 18, 2014

(65) Prior Publication Data

US 2015/0155682 A1    Jun. 4, 2015

Related U.S. Application Data

(63) Continuation of application No. 14/345,379, filed as application No. PCT/US2011/058756 on Nov. 1, 2011, now Pat. No. 8,937,981.

(51) Int. Cl.
*H01S 5/00*    (2006.01)
*H01S 3/136*   (2006.01)
(Continued)

(52) U.S. Cl.
CPC . *H01S 3/136* (2013.01); *H01S 3/10* (2013.01); *H01S 5/0261* (2013.01); *H01S 5/0265* (2013.01); *H01S 5/0427* (2013.01);
(Continued)

(58) Field of Classification Search
CPC ....... H01S 3/10; H01S 5/0427; H01S 5/0265; H01S 5/06213; H01S 5/06216; H01S 5/06226

USPC ............... 372/46.01, 45.01, 43.01, 29, 26
See application file for complete search history.

(56) References Cited

U.S. PATENT DOCUMENTS 4,408,330 A    10/1983  An
5,764,670 A *   6/1998  Ouchi ................. 372/45.01
(Continued)

FOREIGN PATENT DOCUMENTS

CN    1476132 A      2/2004
JP    2005-093742 A  4/2005
(Continued)

OTHER PUBLICATIONS

International Search Report for corresponding PCT/US2011/058756, completed Aug. 21, 2012 by Sun Hee Na of the KIPO, ISA/KR.
(Continued)

*Primary Examiner* — Kinam Park
(74) *Attorney, Agent, or Firm* — Tarolli, Sundheim, Covell & Tummino L.L.P.T.

(57) ABSTRACT

One example includes a laser system. The system can include a first electrode to transmit first electrical carriers into an active region via a first waveguide region in response to a current signal. The system also includes a second electrode to transmit second electrical carriers into the active region via a second waveguide region in response to the current signal. The first and second electrical carriers can be combined in the active region to emit photons to generate an optical signal. The system further includes a third electrode responsive to a signal to affect a concentration of third electrical carriers in a device layer located proximal to the second waveguide region to modulate an optical characteristic of the optical signal.

15 Claims, 3 Drawing Sheets

(51) Int. Cl.
*H01S 5/042* (2006.01)
*H01S 5/026* (2006.01)
*H01S 5/062* (2006.01)
*H01S 3/10* (2006.01)
*H01S 5/02* (2006.01)
*H01S 5/10* (2006.01)
*H01S 5/22* (2006.01)
*H01S 5/024* (2006.01)

(52) U.S. Cl.
CPC ......... *H01S5/06203* (2013.01); *H01S 5/06213* (2013.01); *H01S 5/06216* (2013.01); *H01S 5/021* (2013.01); *H01S 5/02461* (2013.01); *H01S 5/0424* (2013.01); *H01S 5/0425* (2013.01); *H01S 5/0624* (2013.01); *H01S 5/06226* (2013.01); *H01S 5/1032* (2013.01); *H01S 5/1071* (2013.01); *H01S 5/222* (2013.01); *H01S 5/2222* (2013.01); *H01S 2301/176* (2013.01)

(56) References Cited

U.S. PATENT DOCUMENTS

| | | |
|---|---|---|
| 6,437,372 B1 | 8/2002 | Geva et al. |
| 6,526,083 B1 * | 2/2003 | Kneissl et al. ............. 372/50.22 |
| 6,849,866 B2 | 2/2005 | Taylor |
| 7,869,473 B2 * | 1/2011 | Ye et al. .......................... 372/28 |
| 8,937,981 B2 * | 1/2015 | Liang ......................... 372/46.01 |
| 2003/0006407 A1 | 1/2003 | Taylor |
| 2003/0081642 A1 | 5/2003 | Hwang et al. |
| 2004/0264530 A1 | 12/2004 | Ryou et al. |
| 2009/0080488 A1 * | 3/2009 | Hatakeyama et al. ..... 372/50.11 |
| 2011/0073989 A1 | 3/2011 | Rong et al. |

FOREIGN PATENT DOCUMENTS

| | | |
|---|---|---|
| JP | 2005093742 A | 4/2005 |
| JP | 2010-278396 A | 12/2010 |

OTHER PUBLICATIONS

Dai, D. et al., "High Speed Modulation of Hybrid Silicon Evanescent Lasers," Integrated Photonics and Nanophotonics Research and Applications, Optical Society of America. Jul. 12, 2009, 3 pages.

European Search Report received in EP Application No. 11875113.0, Jul. 30, 2015, 3 pages.

Liu, A. et al., "High-Speed Optical Modulation Based on Carrier Depletion in a Silicon Waveguide," Optics Express, vol. 15, No. 2, Jan. 22, 2007, pp. 660-668.

* cited by examiner

DIRECT MODULATED LASER

RELATED APPLICATIONS

This application is a continuation of U.S. patent application Ser. No. 14/345,379, filed 17 Mar. 2014, which is a U.S. National Stage under 35 USC 371 patent application, claiming priority to Serial No. PCT/US2011/058756, filed on 1 Nov. 2011, both of which are incorporated herein in their entirety.

BACKGROUND

Optical systems are becoming more prevalent in modern communications systems as the demand for high-speed and high-efficiency communications increases. Optical systems can employ lasers to generate optical signals. Typical semiconductor lasers can emit photons based on recombining positive and negative electrical carriers in an active region. In the case of electrically driven lasers, this process is in response to generating a current through respective positive and negative doped regions and metal electrodes in the laser. The concentration of the positive and negative carriers can be controlled in the active region, such as based on the magnitude of the current. As a result, a typical laser can be modulated to change wavelength and/or intensity based on the magnitude of the current through the active region of the laser.

DETAILED DESCRIPTION

Figure 1:
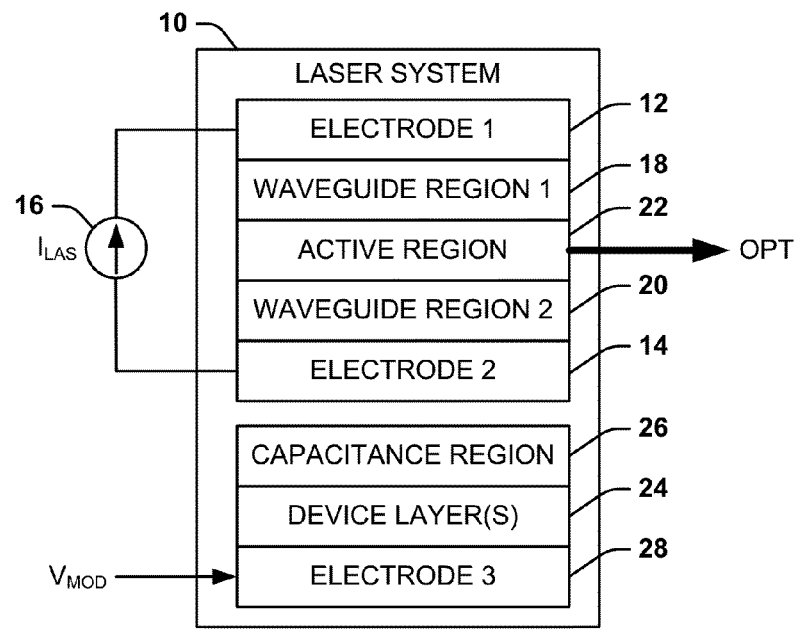
FIG. 1 illustrates an example diagram of a laser system.

FIG. 1 illustrates an example diagram of a laser system 10. The laser system 10 can be employed in any of a variety of optical systems, such as in optical communications and optical interconnect systems. As an example, the laser system 10 can be implemented as a ring-resonator laser or as a linear-resonator laser. It is to be understood that the following description of the example of FIG. 1 is diagrammatical, such that the layout of the example of FIG. 1 is not intended to be physically descriptive of the laser system 10.

The laser system 10 includes a first electrode 12 and a second electrode 14 through which a current $I_{LAS}$ is applied via a current source 16. The first electrode and second electrodes 12 and 14 can be configured as metal electrodes. As an example, the laser system 10 can be implemented as a hybrid silicon (Si) laser, which can be composed of photon-emitting compound semiconductor layers on top of a Si layer. For example, the first electrode 12 can be coupled to a P-doped contact layer and the second electrode 14 can be coupled to an N-doped contact layer. While the electrical stimulation of the first and second electrodes 12 and 14 is described herein as via a current source (i.e., the current source 16), it is to be understood that the laser system 10 could instead implement a voltage source to provide electrical stimulation to the first and second electrodes 12 and 14.

In the example of FIG. 1, the first electrode 12 is coupled with a first waveguide region 18 and the second electrode 14 is coupled with a second waveguide region 20. As an example, the first and second waveguide regions 18 and 20 can each be formed from a doped III-V compound material, such as indium phosphide (InP). Thus, the first waveguide region 18 can be formed from P-doped InP (i.e., P—InP) and the second waveguide region 20 can be formed from N-doped InP (i.e., N—InP). In response to the application of the current $I_{LAS}$ to the first and second electrodes 12 and 14, the first and second waveguide regions 18 and 20 can be configured to transmit electrical carriers, such as holes in the first waveguide region 18 and electrons in the second waveguide region 20. The electrical carriers can be recombined in an active region 22 that interconnects the first and second waveguide regions 18 and 20 to emit photons that generate an optical signal OPT, which can be a laser beam.

The density of the photons that are emitted from the active region 22 can be based on a carrier concentration in the active region 22 and on optical losses that are associated with the active region 22, the waveguide regions 18 and 20, the electrodes 12 and 14, and one or more device layers 24 in the laser system 10 as the optical signal OPT resonates therein. In addition to losses associated with the materials of the laser system 10, waveguide imperfection can also contribute to the total optical losses of the laser system 10. For example, photons that are emitted from the active region 22 can result in optical modes that are partially confined within the first and/or second waveguide regions 18 and 20, as well as one or more of the device layers 24, based on similar refractive indices and close physical proximity of the first and second waveguide regions 18 and 20 and the device layer(s) 24 with the active region 22. The carrier concentration in the active region 22 can be controlled based on the magnitude of the current $I_{LAS}$, such that the current $I_{LAS}$ can be increased to generate sufficient photons to overcome the total optical loss, and thus to generate the optical signal OPT. Therefore, the photon density, and thus the intensity and/or wavelength of the optical signal OPT, can be modulated based on the magnitude of the current $I_{LAS}$. However, increasing and decreasing the magnitude of the current $I_{LAS}$ can result in simultaneous shifting of the wavelength, called chirp, which can be undesirable for wavelength-division multiplexing applications where each channel of a signal is intended to be locked at a specific wavelength. In addition, increasing and decreasing the magnitude of the current $I_{LAS}$ can also require high output power to achieve high-speed modulation of the laser system 10, which can cause excessive power consumption.

The laser system 10 further includes a capacitance region 26, as well as a third electrode 28 that is coupled to the device layer(s) 24. The capacitance region 26 can be a capacitive region internal to the laser system 10 that is collectively based on the second electrode 14, the device layer(s) 24, the third electrode 28, and a thin insulating layer between the device layer(s) 24 and second waveguide region 20. As an example, the third electrode 28 can be a metal electrode that can be coupled to a P-type contact layer. The third electrode 28 receives electrical stimulation in the form of a bias voltage $V_{MOD}$ relative to the electrical stimulation of the current $I_{LAS}$ to the second electrode 14. As an example, the bias voltage $V_{MOD}$ can be an adjustable DC voltage or an AC voltage, or can be implemented as an AC bias voltage with a DC component.

In response to an electric field generated by a difference between the bias voltage $V_{MOD}$ and a voltage at the second electrode 14, additional electrical carriers can accumulate in the device layer(s) 24 and the second waveguide region 20 to adjust a capacitance of the capacitance region 26. As a result of the electrical carrier accumulation and depletion, and thus the effects on the capacitance in the capacitance region 26, the refractive index associated with the materials surrounding the capacitance region 26 can be reduced and the total optical loss associated with the materials surrounding the capacitance region 26 can be increased. Therefore, the optical modes that can be confined within the first waveguide region 18, the second waveguide region 20, the active region 22, and the device layer(s) 24 are changed accordingly. As a result, the balance between photon generation due to the current $I_{LAS}$ and the total optical loss can be adjusted to cause intensity variation of the optical signal OPT. Accordingly, the magnitude of the current $I_{LAS}$ can be held at a substantially constant magnitude to set a substantially constant carrier concentration in the active region 22, and the bias voltage $V_{MOD}$ can be adjusted to change the capacitance of the capacitance region 26 to modulate the optical signal OPT.

Because of the extremely fast nature of the charging and discharging of the capacitance region 26, the variation of refractive index and loss in optical mode can be inherently much faster than the carrier diffusion process which limits the speed of typical carrier-injection modulation lasers. The speed in a conventional current-modulated semiconductor laser is proportional to the output intensity of signal OPT. Thus, higher modulation speed requires greater current injection, which can result in higher dissipated electrical power. In many situations, increased dissipated electrical power can cause increased device heating, which can compromise device performance (e.g., resulting in lower output intensity, higher lasing threshold, decreased speed, shifts towards higher lasing wavelengths, and/or reliability issues), and can result in thermal-based limitations in modulation speed.

In contrast to typical current-modulated laser systems, because the modulation speed the optical signal OPT of the laser system 10 does not depend on the magnitude of the current $I_{LAS}$, the current $I_{LAS}$ can be held at a substantially constant magnitude, resulting in substantially low dissipation of electrical power. Additionally, because substantially no current flows between the electrode 14 and the third electrode 28, modulation of the optical signal OPT can be performed in the laser system 10 simplistically (e.g., with easily integrated external electrical control circuit) and with approximately no DC power consumption. Accordingly, the laser system 10 can operate at very high speed and has a unit power consumption per bit of information that is substantially lower than typical direct modulated laser systems. In addition, wavelength chirp in the laser system 10 due to carrier accumulation or depletion at the capacitance region 26 can be substantially minimized based on a corresponding decrease or increase of the carrier concentration in the active region 22 by respectively reducing or increasing the magnitude of the current $I_{LAS}$ in addition to modulating the voltage $V_{MOD}$. The laser system 10 can therefore be modulated very quickly and with a small wavelength chirp, as opposed to typical laser systems. Furthermore, because the laser system 10 integrates only one additional electrode (i.e., the third electrode 28) relative to typical laser systems, the laser system 10 can be fabricated in an inexpensive manner with a small footprint.

Figure 2:
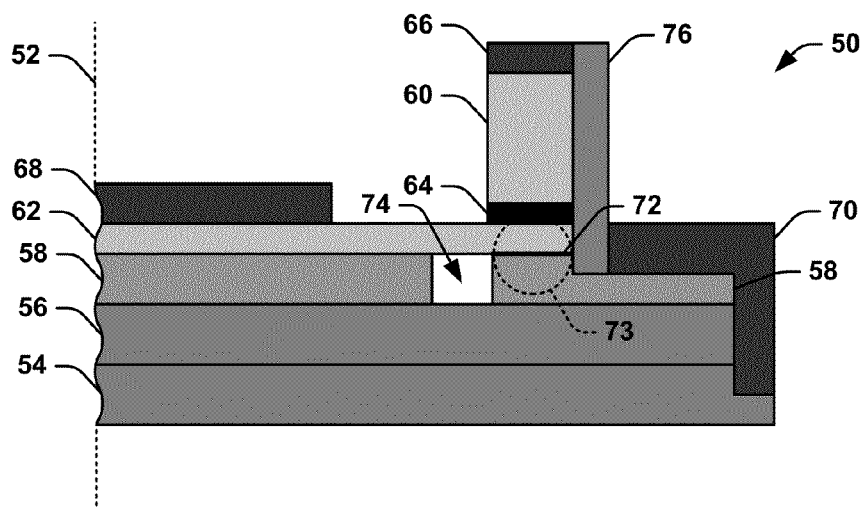
FIG. 2 illustrates an example of a ring laser.

FIG. 2 illustrates an example of a ring laser 50. As an example, the ring laser 50 can include any of a variety of standing-wave resonator lasers. The ring laser 50 is demonstrated in a partial cross-sectional view (e.g., approximate half cross-section), such that a mirror image of the ring laser 50 along the dashed line 52 has been omitted from the example of FIG. 2 due to symmetry. The ring laser 50 can correspond to the laser system 10 in the example of FIG. 1. Therefore, reference is to be made to the example of FIG. 1 in the following description of the example of FIG. 2.

The ring laser 50 includes a substrate 54, which can be formed from undoped Si. The ring laser 50 also includes a buried oxide layer 56 on the substrate 54. The ring laser 50 further includes a device layer 58 on the buried oxide layer 56. As an example, the device layer 58 can be formed from Si. Therefore, the ring laser 50 can be fabricated in a silicon-on-insulator (SOI) fabrication process. The ring laser 50 also includes a first waveguide region 60 and a second waveguide region 62, which can be fabricated from a P-doped and an N-doped group III-V material, respectively, such as InP. The second waveguide region 62 can be formed on a portion of the device layer 58 and can be separated from the first waveguide region 60 by an active layer 64. As an example, the active layer 64 can include a plurality of quantum wells, such as formed from indium aluminum gallium arsenide (InAlGaAs).

The ring laser 50 further includes a first electrode 66 coupled to the first waveguide region 60 and a second electrode 68 coupled to the second waveguide region 62. As an example, the first and second electrodes 66 and 68 can include doped contact layers (not shown), such as P-doped indium gallium arsenide (InGaAs) and N-doped indium phospide InP, respectively. In addition, the ring laser 50 includes a third electrode 70 that is partially formed on the device layer 58 and which extends along the device layer 58, the buried oxide layer 56, and the substrate 54. Therefore, in the example of FIG. 2, the third electrode 70 can act as a thermal shunt during operation of the ring laser 50. Similar to the first and second electrodes 66 and 68, the third electrode 70 can include a doped contact layer (not shown), such as a P-doped compound semiconductor. Alternatively, the electrodes, 66, 68, and 70 can be metal, and the portion of the device layer 58 over which the third electrode 70 is formed can be doped (e.g., P-doped).

At the junction between the device layer 58 and the second waveguide region 62 is a very thin interfacial oxide layer 72. As an example, the interfacial oxide layer 72 can be formed from native oxides of InP from the second waveguide region 62 and Si from the device layer 58 that can inherently combine in a thin layer (e.g., approximately 15 nm) during fabrication. The interfacial oxide layer 72 can thus define a capacitance region 73 between the device layer 58 and the second gain layer 62. In addition, the ring laser 50 can include one or more additional non-native dielectric layers having a high k-constant formed on or instead of the interfacial oxide layer 72. The insulator material properties and/or thickness can affect carrier accumulation at the capacitance region 73 as well as optical mode overlap for the second waveguide layer 62 and the device layer 58. In addition, the additional non-native dielectric layer(s) can serve as a protection layer for the second waveguide layer 62 and/or the device layer 58 during fabrication.

In addition, in the example of FIG. 2, a trench 74 has been etched into the device layer 58 of the ring laser 50 to confine the capacitance region 73 of the interfacial oxide layer 72 to beneath the active region 64. In this way, modulation bandwidth (i.e., speed) resulting from a product of capacitance and resistance can be very high. Furthermore, the width and position of the trench 74 can be designed to allow the device layer 58 to only support a single optical mode, resulting in single mode lasing of the optical signal OPT. Furthermore, in the example of FIG. 2, an insulator layer 76 is coupled to an outer sidewall of the ring resonator defined by the waveguide layers 60 and 62 and the active region 64. The insulator layer 76 can electrically isolate the third electrode 70 from the III-V materials of the ring laser 50, and can confine the optical modes to the ring resonator cavity, preventing metal optical absorption in the third electrode 70.

Figure 3:
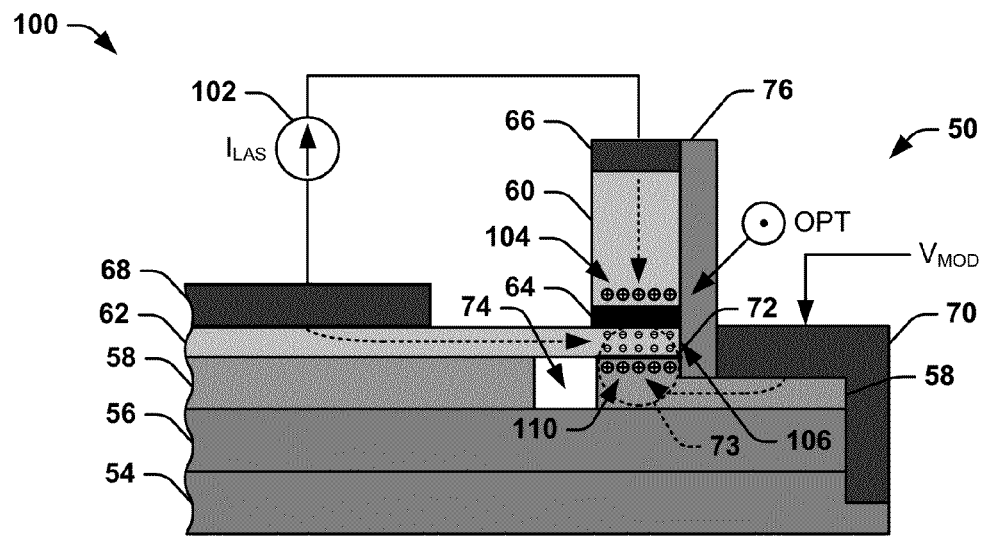
FIG. 3 illustrates an example diagram of modulation of the ring laser of the example of FIG. 2.

FIG. 3 illustrates an example diagram 100 of modulation of the ring laser 50 of the example of FIG. 2. In the example of FIG. 3, a current source 102 is coupled to the first electrode 66 and the second electrode 68 to generate a current $I_{LAS}$ that flows through the first electrode 66, the first waveguide region 60, the active region 64, the second waveguide region 62, and the second electrode 68. In response to the current $I_{LAS}$, P-type carriers 104 (i.e., holes) are injected from the first electrode 66 through the first waveguide region 60 to the active region 64, and N-type carriers 106 (i.e., electrons) are injected from the second electrode 68 through the second waveguide region 62 to the active region 64. The P-type and N-type carriers 104 and 106 are combined in the active region 64 to emit photons that can resonate around the ring laser 50 to generate the optical signal OPT, demonstrated in the example of FIG. 3 as resonating out of the page (i.e., around a circular ring pattern) proximal to the active region 64 and the capacitance region 73. In addition, as described above in the example of FIG. 1, optical modes from the photons emitted from the active region 64 can become partially confined in the first and second waveguide regions 60 and 62, the active region 64, and the device layer 58, based on similar refractive indices and close physical proximity of the first and second waveguide regions 60 and 62 and the device layers 58 with the active region 64.

In the example of FIG. 3, the magnitude of the current $I_{LAS}$ can be substantially constant, such that the concentration of the P-type and N-type carriers 104 and 106 can be substantially constant. In addition, a bias voltage $V_{MOD}$ is applied to the third electrode 70, such as relative to the second electrode 68. In response to the bias voltage $V_{MOD}$, an electric field within the ring laser 50 that is directed through the device layer 58, the interfacial oxide layer 72, and the waveguide layer 62 is formed. Under the effect of electric field, and as a result of the interfacial oxide layer 72 and the trench 74, the P-type carriers 110 become trapped or depleted in the capacitance region 73 at the device layer 58. Concurrently, an approximately same amount of N-type carriers 106 as the P-type carriers 110 become likewise trapped or depleted in the capacitance region 73 (i.e., on the other side of the interfacial oxide 72 in the second waveguide region 62). The depletion and accumulation process can be determined by the direction of this electric field, which can be controlled by the polarity of bias voltage $V_{MOD}$. The carrier variation in the capacitance region 73 thus adjusts the refractive index of the waveguide layer 62 and the device layer 58. In addition, the optical losses of the device layer 58 and the second waveguide region 62 can be correspondingly increased or reduced, thus effectively increasing or reducing total optical mode losses. The impact to total optical mode can be determined by how strong optical modes overlap in the device layer 58 and the second waveguide region 62.

The introduction of the additional optical mode losses can thus offset a balance between the photon generation rate in the active region 64 resulting from the current $I_{LAS}$ and the original total optical losses. Therefore, a change in intensity and/or wavelength of the optical signal OPT can be realized. The amplitude of the intensity change can be determined by variation in the carrier concentration in the capacitance region 73, which is thus based on the magnitude of the bias voltage $V_{MOD}$ applied at the third electrode. Accordingly, the optical signal OPT can be modulated based on changing the magnitude of the bias voltage $V_{MOD}$.

As an example, the ring laser 50 can be implemented in applications where the absolute wavelength of each signal channel need not be fixed while channel spacing can remain fixed. The change in refractive index in the second waveguide region 62 and the device layer 58 can induce a phase change in the optical modes that can be supported by the resonator cavity of the ring laser 50. As a result, the resonance wavelength of the optical signal OPT can likewise be modulated by the bias voltage $V_{MOD}$. As an example, wavelength tuning can be realized by adding a DC component to the bias voltage $V_{MOD}$, such that the baseline carrier concentration around capacitance region 73 is controllable in response to this DC bias only, allowing tuning of the initial characteristics of the optical signal OPT, such as wavelength (i.e, phase) of the optical signal OPT. As yet another example, the ring laser 50 may be implemented in applications where the absolute wavelength of each signal channel is intended to be fixed. In such applications, the optical signal OPT can be intensity modulated based on modulation of the bias voltage $V_{MOD}$, while a phase change of the optical signal OPT can be prevented based on modulation of the current $I_{LAS}$. Based on the modulation of the bias voltage $V_{MOD}$ to provide intensity modulation of the optical signal OPT, as described herein, the modulated current $I_{LAS}$ can still be held at substantially minimal amplitudes to mitigate power consumption.

Figure 4:
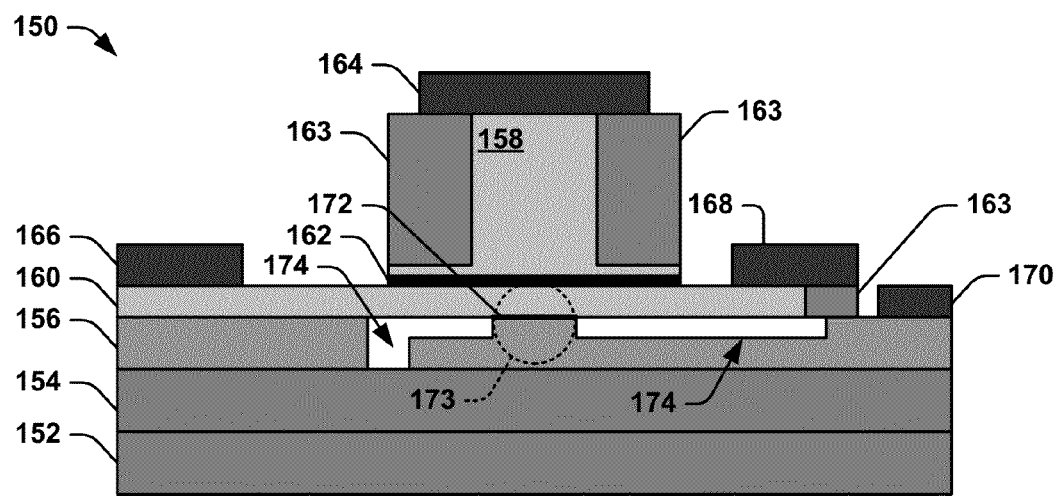
FIG. 4 illustrates an example of a linear laser.

FIG. 4 illustrates an example of a linear laser 150. The linear laser 150 is demonstrated in a cross-sectional view. The linear laser 150 can likewise correspond to the laser system 10 in the example of FIG. 1. Therefore, reference is to be made to the example of FIG. 1 in the following description of the example of FIG. 4. As an example, the linear laser 150 can include any of a variety of standing-wave resonator lasers, such as Fabry-Perot, distributed feedback, and distributed Bragg reflector resonator lasers.

The linear laser 150 includes a substrate 152, which can be formed from undoped Si. The linear laser 150 also includes a buried oxide layer 154 on the substrate 152. The linear laser 150 further includes a device layer 156 on the buried oxide layer 154. As an example, the device layer 156 can be formed from Si. Therefore, the linear laser 150 can be fabricated on a silicon-on-insulator (SOI) substrate. The linear laser 150 also includes a first waveguide region 158 and a second waveguide region 160, which can be fabricated from a P-doped and an N-doped compound III-V material, respectively, such as InP. The second waveguide region 160 is demonstrated in the example of FIG. 4 as formed on a portion of the device layer 156 and is separated from the first waveguide region 158 by an active layer 162. The linear laser 150 further includes doped regions 163 in the first and second waveguide regions 158 and 160. The regions 163 can be doped with protons, such as H+ ions, to substantially prevent motion of P-type carriers (i.e., holes) through them, such as to facilitate motion of the P-type carriers through a central region of the first waveguide layer 158.

The linear laser 150 includes a first electrode 164 coupled to the first waveguide region 158. The linear laser 150 further includes a first sub-electrode 166 and a second sub-electrode 168 that collectively form a second electrode and are each coupled to the second waveguide region 160. Similar to the ring laser 50 in the example of FIGS. 2 and 3, the first electrode 164 can include a doped contact layer (not shown), such as P-doped InGaAs, and the first and second sub-electrodes 166 and 168 can likewise include doped contact layers (not shown), such as N-doped InP. In addition, the linear laser 150 includes a third electrode 170 that is formed on the device layer 156. The third electrode 170 can include a doped semiconductor material contact layer (now shown), such as P-doped Si.

At the junction between the device layer 156 and the second waveguide region 160 is a very thin interfacial oxide layer 172. As an example, the interfacial oxide layer 172 can be formed from native oxides of InP from the second waveguide region 160 and Si from the device layer 156 that can inherently combine in a thin layer (e.g., approximately 15 nm) during fabrication. Additionally or alternatively, the interfacial oxide layer 172 can include additionally deposited dielectric layers, similar to as described above in the example of FIG. 2. The interfacial oxide layer 172 can thus define a capacitance region 173 between the device layer 156 and the second gain layer 160. Similar to as described above in the example of FIG. 2, the linear laser 150 can also include one or more additional dielectric layers having a high k-constant formed on the interfacial oxide layer 172 that can affect carrier accumulation at the capacitance region 173. Furthermore, also similar to as described above in the example of FIG. 2, in the example of FIG. 4, trenches 174 have been etched into the device layer 156 of the linear laser 150 to confine the carriers in the capacitance region 173 of the interfacial oxide layer 172 in the second waveguide region 160.

Figure 5:
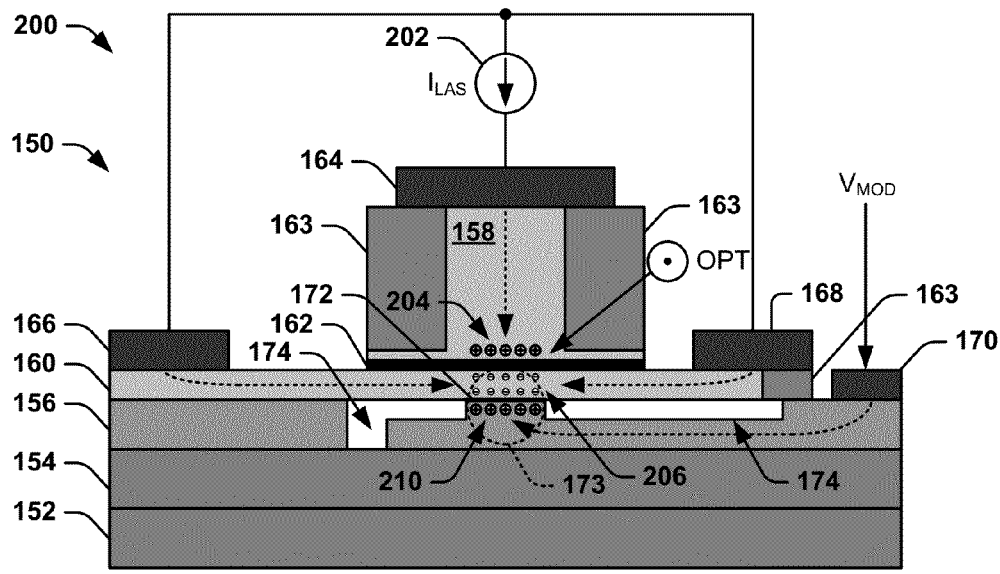
FIG. 5 illustrates an example diagram of modulation of the linear laser of the example of FIG. 4.

FIG. 5 illustrates an example diagram 200 of modulation of the linear laser 150 of the example of FIG. 4. In the example of FIG. 5, a current source 202 is coupled to the first electrode 164, as well as the first and second sub-electrodes 166 and 168, to generate a current $I_{LAS}$ that flows through the first electrode 164, the first waveguide region 158, the active region 162, the second waveguide region 160, and the first and second sub-electrodes 166 and 168. In response to the current $I_{LAS}$, P-type carriers 204 (i.e., holes) are injected from the first electrode 164 and/or the first waveguide region 158 to the active region 162. In the example of FIG. 5, the H-doped regions 163 are arranged to provide a more narrow channel for the P-type carriers 204 to reach the active region 162. Also in response to the current $I_{LAS}$, N-type carriers 206 (i.e., electrons) are injected from the first and second sub-electrodes 166 and 168 and/or the second waveguide region 160 to the active region 162. The P-type and N-type carriers 204 and 206 are thus combined in the active region 162 to emit photons that can resonate in a linear cavity of the linear laser 150 to generate the optical signal OPT, demonstrated in the example of FIG. 5 as resonating in and out of the page (i.e., linearly) proximal to the active region 162 and the capacitance region 173. In addition, as described above in the example of FIG. 1, optical modes from the photons emitted from the active region 162 can become partially confined in the first and/or second waveguide regions 158 and 160, as well as the device layer 156, based on similar refractive indices and close physical proximity of the first and second waveguide regions 158 and 160 and the device layers 156 with the active region 162.

In the example of FIG. 5, the magnitude of the current $I_{LAS}$ can be substantially constant, such that the concentration of the P-type and N-type carriers 204 and 206 can be substantially constant. In addition, a voltage source 208 is demonstrated as applying an AC and/or a DC bias voltage $V_{MOD}$ to the third electrode 170 relative to the first and second sub-electrodes 166 and 168. In response to the bias voltage $V_{MOD}$, the third electrode 170 injects P-type carriers 210 (e.g., holes) into the device layer 156. The H-doped region 163 of the device layer 156 prevents the P-type carriers 210 from moving into the device layer 156.

As a result of the interfacial oxide layer 172 and the trenches 174, the P-type carriers 210 become trapped in the capacitance region 173 of the device layer 156. Therefore, the P-type carriers 210 generate an electric field within the linear laser 150 that is directed through the device layer 156, the second waveguide region 160, the first waveguide region 158, and the active region 162. The electric field thus adjusts the refractive index of one or more of the device layer 156, the first waveguide region 158, and the second waveguide region 160. As a result, the optical losses of the device layer 156, the first waveguide region 158, and the second waveguide region 160 can be substantially reduced, thus freeing the optical modes that are partially confined therein. Accordingly, in a manner similar to as described above in the example of FIG. 3, the optical signal OPT can be modulated based on changing the magnitude of the bias voltage $V_{MOD}$.

It is to be understood that the ring laser 50 and the linear laser 150 are not intended to be limited to the examples of FIGS. 2 and 3 and FIGS. 4 and 5, respectively. As an example, any of a variety of fabrication techniques can be implemented in the formation of the ring laser 50 and/or linear laser 150. Therefore, the physical configurations of the ring laser 50 and the linear laser 150, respectively, are not intended to be limited to the examples of FIGS. 2 and 3 and FIGS. 4 and 5, respectively. In addition, while the techniques described herein have been described in the context of a ring laser 50 and a linear laser 150 configured as hybrid Si lasers, the techniques described herein can be implemented for any of a variety of other material configurations of lasers.

Figure 6:
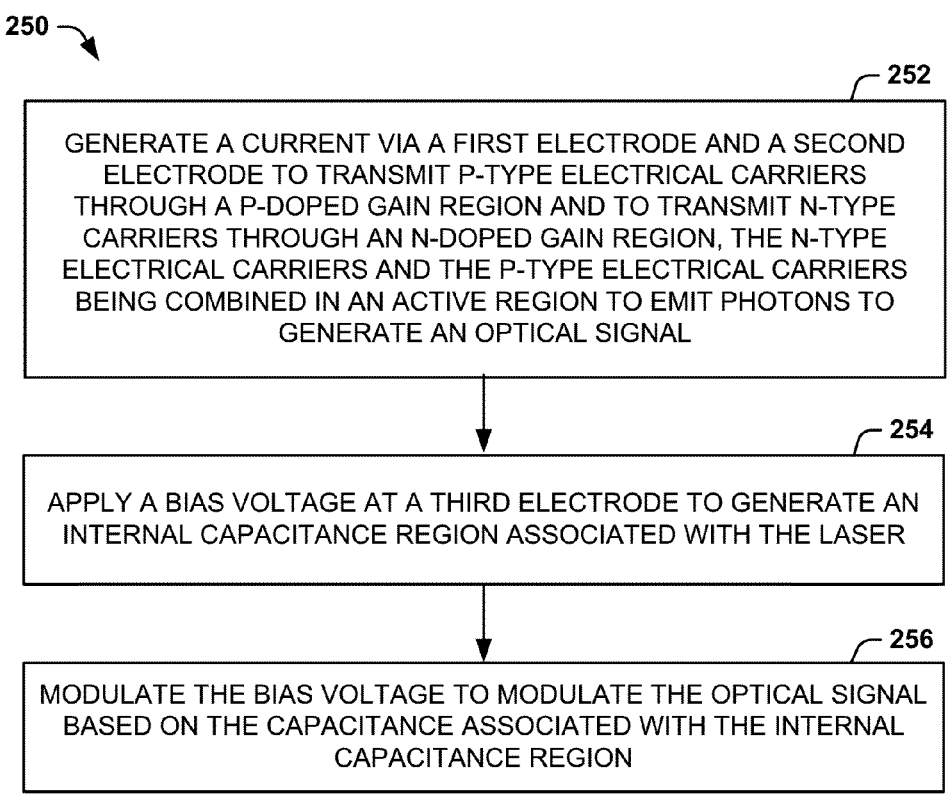
FIG. 6 illustrates an example method for modulating a laser.

In view of the foregoing structural and functional features described above, an example method will be better appreciated with reference to FIG. 6. While, for purposes of simplicity of explanation, the method of FIG. 6 is shown and described as executing serially, it is to be understood and appreciated that the method is not limited by the illustrated order, as parts of the method could occur in different orders and/or concurrently from that shown and described herein.

FIG. 6 illustrates an example of a method 250 for modulating a laser. At 252, a current (e.g., the current $I_{LAS}$) is generated via a first electrode (e.g., the first electrode 12) and a second electrode (e.g., the second electrode 14) to transmit P-type electrical carriers (e.g., the P-type carriers 104) through a P-doped waveguide region (e.g., the first waveguide region 18) and to transmit N-type carriers (e.g., the N-type carriers 106) through an N-doped waveguide region (e.g., the second waveguide region 20), the N-type electrical carriers and the P-type electrical carriers being combined in an active region (e.g., the active region 22) to emit photons to generate an optical signal (e.g., the optical signal OPT). At 254, a bias voltage (e.g., the bias voltage $V_{MOD}$) is applied at a third electrode (e.g., the third electrode 28) to generate an internal capacitance region (e.g., the capacitance region 26) associated with the laser. At 256, the bias voltage is modulated to modulate the optical signal based on changes in a capacitance associated with the internal capacitance region.

What have been described above are examples. It is, of course, not possible to describe every conceivable combination of components or methodologies, but one of ordinary skill in the art will recognize that many further combinations and permutations are possible. Accordingly, the invention is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A laser system comprising:
   a first electrode to transmit first electrical carriers into an active region via a first waveguide region in response to a current signal;
   a second electrode to transmit second electrical carriers into the active region via a second waveguide region in response to the current signal, the first and second electrical carriers being combined in the active region to emit photons to generate an optical signal; and
   a third electrode responsive to a signal to affect a concentration of third electrical carriers in a device layer located proximal to the second waveguide region to modulate an optical characteristic of the optical signal.

2. The system of claim 1, wherein the signal affects the concentration of the third electrical carriers in the device layer to modulate optical characteristic of the optical signal based on changing a capacitance of an internal capacitance region associated with at least one of the first waveguide region, the second waveguide region, and the device layer.

3. The system of claim 2, further comprising a trench etched into the device layer to confine the second and third electrical carriers to the internal capacitance region in the second waveguide region and the device layer, and to facilitate single mode operation of the optical signal.

4. The system of claim 2, further comprising an insulating layer formed on the internal capacitance region to substantially increase accumulation of the third electrical carriers in the device layer.

5. The system of claim 2, wherein the change in capacitance varies at least one of total optical loss and refractive index of at least one of the first waveguide region, the second waveguide region, the active region, and the device layer.

6. The system of claim 1, wherein the third electrode is formed to couple the device layer, a substrate layer, and at least one additional layer interconnecting the device layer and the substrate layer to provide thermal shunting.

7. The system of claim 1, wherein the current signal is a substantially constant current through the first and second electrodes and the first and second waveguide regions, and wherein the signal is a bias voltage that is modulated to modulate the optical characteristic of the optical signal.

8. A method for modulating a laser, the method comprising:
   applying a signal between a first electrode and a second electrode to transmit first electrical carriers through a first doped waveguide region and to transmit second electrical carriers through a second doped waveguide region that is separated from the first doped waveguide region by an active region where the first and second electrical carriers are combined to emit photons to generate an optical signal;
   applying a bias voltage to a third electrode to provide third electrical carriers to a device layer that is separated from the second doped waveguide region by an insulating layer; and
   modulating the bias voltage to modulate an optical characteristic of the optical signal based on changes in a concentration of the third electrical carriers.

9. The method of claim 8, wherein the first electrical carriers and the third electrical carriers are the same type of electrical carriers.

10. The method of claim 8, wherein modulating the bias voltage comprises changing at least one of total optical loss and a refractive index associated with at least one of the first doped waveguide region, the second doped waveguide region, and the device layer based on a change in capacitance of an internal capacitance region associated with the second doped waveguide region, the insulating layer, and the device layer.

11. The method of claim 8, further comprising modulating the signal independently of the bias voltage to modulate an intensity of the optical signal.

12. The method of claim 8, wherein modulating the bias voltage comprises modulating the bias voltage independently of the signal to modulate a wavelength of the optical signal.

13. A laser system comprising:
   a first electrode associated with a first waveguide region to receive first electrical stimulation;
   a second electrode associated with a second waveguide region to receive second electrical stimulation;
   an active region interconnecting the first and second waveguide regions to emit photons to generate an optical signal in response to the first and second electrical stimulation;
   a third electrode to receive third electrical stimulation; and
   a device layer that cooperates with the second waveguide region to form an internal capacitance region that is confined via a trench, the internal capacitance region having a capacitance that varies based on modulation of the third electrical stimulation to modulate an optical characteristic of the optical signal.

14. The system of claim 13, wherein the first electrical stimulation is to transmit first electrical carriers into the active region via the first waveguide region, wherein the second electrical stimulation is to transmit second electrical carriers into the active region via a second waveguide region, and wherein the third electrical stimulation is to transmit third electrical carriers into the device layer, the third electrical carriers being the same type of electrical carrier as the first electrical carriers, wherein the third electrical stimulation is modulated to affect a concentration of the third electrical carriers in the device layer to modulate the optical characteristic of the optical signal.

15. The system of claim 13, wherein the trench is arranged to have a width and a position relative to the device layer to allow the device layer to support a single optical mode, such that the optical signal is a single mode optical signal.

* * * * *